(12) United States Patent
Leenders et al.

(10) Patent No.: US 7,119,886 B2
(45) Date of Patent: Oct. 10, 2006

(54) LITHOGRAPHIC APPARATUS, DEVICE MANUFACTURING METHOD, AND ANGULAR ENCODER

(75) Inventors: Martinus Hendrikus Antonius Leenders, Rotterdam (NL); Hendricus Johannes Maria Meijer, Veldhoven (NL); Engelbertus Antonius Fransiscus Van Der Pasch, Oirschot (NL); Michael Jozef Mathijs Renkens, Sittard (NL); Theo Anjes Maria Ruijl, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 10/833,340

(22) Filed: Apr. 28, 2004

(65) Prior Publication Data
US 2005/0018162 A1    Jan. 27, 2005

(30) Foreign Application Priority Data
Apr. 29, 2003   (EP) .................................. 03252746

(51) Int. Cl.
*G01C 3/08*   (2006.01)
*G01B 11/14*  (2006.01)
*G03B 27/54*  (2006.01)

(52) U.S. Cl. .................. 356/3.1; 356/4.05; 356/614; 356/623; 355/67

(58) Field of Classification Search ............... 355/67, 355/71; 356/3.1, 4.05, 614, 623
See application file for complete search history.

(56) References Cited

U.S. PATENT DOCUMENTS

| | | | |
|---|---|---|---|
| 5,151,749 A * | 9/1992 | Tanimoto et al. | 356/620 |
| 5,801,832 A * | 9/1998 | Van Den Brink | 356/500 |
| 6,160,628 A | 12/2000 | Inoue | 356/500 |
| 6,271,923 B1 | 8/2001 | Hill | |
| 2002/0001082 A1 | 1/2002 | Akimoto et al. | 356/400 |
| 2002/0017890 A1 | 2/2002 | Ebihara et al. | 318/649 |
| 2003/0053074 A1 | 3/2003 | Hill | |

FOREIGN PATENT DOCUMENTS

EP   1 052 683 A1   11/2000

* cited by examiner

*Primary Examiner*—Rodney Fuller
*Assistant Examiner*—Vivian Nelson
(74) *Attorney, Agent, or Firm*—Pillsbury Winthrop Shaw Pittman, LLP

(57) ABSTRACT

In a lithographic projection apparatus, a measuring system configured to measure the position of the projection system relative to a reference frame includes sensors rigidly mounted in relation to counterpart sensors of a measuring system measuring the substrate table position. An angular encoder which sends light from a target down two optical paths having opposite sensitivities to tilt is used to measure rotation of the projection system about its optical axis.

21 Claims, 7 Drawing Sheets

LITHOGRAPHIC APPARATUS, DEVICE MANUFACTURING METHOD, AND ANGULAR ENCODER

CROSS REFERENCE TO RELATED APPLICATION

This application claims priority to European Application 03252746.7, filed Apr. 29, 2003, the entire contents of which are incorporated herein by reference.

BACKGROUND OF THE INVENTION

1. Field of Invention

The present invention relates to lithographic projection apparatus and to device manufacturing methods. The present invention also relates to an angular encoder.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, or several, dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at once, and so-called scanners, in which each target portion is irradiated by scanning the pattern through the projection beam in a given direction (the "scanning"-direction) while synchronously scanning the substrate parallel or anti-parallel to this direction.

In known lithographic projection apparatus that carry out scanning exposures, the positions of the mask stage and the substrate stage are measured relative to the projection system (lens) in order to control the stage positions during the scan. In practice, the positions are measured using interferometers mounted on a rigid reference frame to which the projection lens system is rigidly connected. However, in a proposed lithographic projection apparatus using EUV radiation as the exposure radiation the projection system, a mirror system with positive magnification is compliantly mounted in six degrees of freedom to the reference frame. Otherwise, the requirements on the lens dynamics would be too onerous. The same applies in other types of lithography apparatus. It is therefore necessary to measure the position of the projection system relative to the reference frame, as well as the position of the tables relative to the reference frame. A convenient arrangement to do this is required.

SUMMARY OF THE INVENTION

It is an aspect of the present invention to provide a lithographic apparatus with an improved arrangement for measurement of the position of the projection system relative to a reference frame.

According to the present invention, there is provided a lithographic projection apparatus including a radiation system configured to provide a beam of radiation; a support configured to support a patterning device, the patterning device configured to pattern the beam according to a desired pattern; a substrate table configured to hold a substrate; a projection system configured to project the patterned beam onto a target portion of the substrate; a reference frame; a first measuring system configured to measure positions and/or displacements of the substrate table relative to the reference frame, the measuring system including a plurality of first sensors mounted on the reference frame and having respective measurement axes; and a second measuring system configured to measure positions and/or displacements of the projection system relative to the reference frame, the measuring system including a plurality of second sensors mounted on the reference frame and having respective measurement axes, wherein at least one sensor of the second measuring system has a measurement axis passing through an invariant point of the projection system.

By measuring the position of the projection system on a measurement axis passing through an invariant point, that is a point about which a rotation of the projection system does not cause a translation of the image, calculation of the necessary corrections is simplified and the number of sensors necessary can be reduced.

The invariant point is located in the center of the object or image field of the projection system and may form the origin of a coordinate system used in control of the apparatus.

Preferably, the second measuring system includes three linear sensors measuring along measurement axes passing through the invariant point. In this way the advantages are obtained for all the linear degrees of freedom. In such an arrangement, it is desirable also to have a sensor to measure rotation about the optical axis of the projection system if the patterning device is connected, either rigidly or by servos, to the projection system and the projection system is flexibly connected to the reference frame.

Preferably, at least one sensor of the second measuring system has a measurement axis corresponding to a measurement axis of the first measuring system and is mounted rigidly in relation to the corresponding sensor of the first measurement system. In some cases, the measurement axes of the first and second measuring systems will not be exactly parallel. In such a case, two axes would be considered to correspond if they are in a common plane that also contains the Z axis.

Preferably a sensor of the second measurement system, measuring the position of the projection system, that primarily measures a given degree of freedom, is mounted on the reference frame rigidly with a high stiffness, i.e. relative to the sensor of the first measuring system, measuring the position of the substrate table, that primarily measures the corresponding degree of freedom, the arrangement of sensors can be made more compact and the crosstalk between sensors minimized. Accordingly, the requirements on relative positional stability of the sensors in each system can be reduced.

Most preferably, a self-contained set of sensors is mounted on a single rigid mount. A self-contained set of sensors is one that does not need to refer to other position or displacement sensors in order to provide their measurements. Thus if, for example, Rz is measured by two spaced-apart linear interferometers with beams parallel to the X direction, both interferometers would be mounted on the single rigid mount. Of course, an interferometer model may take account of the outputs of environmental sensors, e.g. temperature, pressure, humidity, that need not be mounted on the rigid mount.

It should be noted that not all the parts of a sensor need be connected rigidly to the reference frame or the corresponding sensor in the other measuring system. Only the parts, such as the interferometer and provisions that supply the measurement beam of an interferometric measurement system or the encoder head of an encoder-type detector, need be mounted on the reference frame. Other parts of the sensors, especially parts which might generate heat, vibration or electrical noise, may be located remotely, if possible.

Preferably, the sensors of the second measuring system primarily measuring the three translational degrees of freedom, X, Y and Z, are rigidly connected to their counterparts in the first measuring system. It will be appreciated that because of volume and layout constraints in an embodiment of the present invention, it may not be possible to position sensors such that their measurement axes are exactly parallel to the axes of the frame of reference of the apparatus. Hence the fact that a given sensor "primarily" measures one degree of freedom, but its output will require correction using the output of another sensor or sensors to compensate for the fact that its measurement axis is not exactly parallel to an axis of the frame of reference.

Preferably, rotation of the projection system about its optical axis is measured by a sensor that makes a direct measurement of the angle.

According to a further aspect of the present invention there is provided a device manufacturing method including projecting a patterned beam of radiation onto a target portion of a layer of radiation-sensitive material at least partially covering a substrate using a projection system; measuring at least one of positions and displacements of the substrate table relative to a reference frame using a first measuring system including a plurality of first sensors mounted on the reference frame and having respective measurement axes; measuring at least one of positions and displacements of the projection system relative to the reference frame using a second measuring system including a plurality of second sensors mounted on the reference frame and having respective measurement axes, wherein at least one sensor of the second measuring system has a measurement axis passing through an invariant point of the projection system and is mounted rigidly in relation to the corresponding sensor of the first measuring system.

The present invention also provides an angular encoder including a target; an optical module including a first beam splitter to direct light from the target into first and second optical paths, a first optical element in at least one of the optical paths wherein one of the paths has an opposite sensitivity to tilt than the other of the optical paths, and a second optical element that recombines light from the first and second optical paths and projects two overlapping images of the target, wherein relative rotation of the target and the optical module causes relative movement of the two overlapping images.

This arrangement provides a single signal that is indicative of the relative rotation of the target and optical module, rather than two signals representing linear movements which must then be processed to give an indication of angle. Also, the sensitivity of the device is not limited by the arm that can be provided between two linear measurements, rather the opposite angle sensitivity of the two optical paths serves to amplify the signal.

Preferably the target is a grating wherein Moiré effects are formed in the overlapped images. The first optical element may include a prism having a pentagonal cross-section in which the beam traveling one optical path undergoes two internal reflections and crosses itself.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to a device that can be used to impart a beam with a pattern in its cross-section such as to create a pattern in a target portion of the substrate. It should be noted that the pattern imparted to the beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. In this manner, the reflected beam is patterned. In each example of patterning devices, the support may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
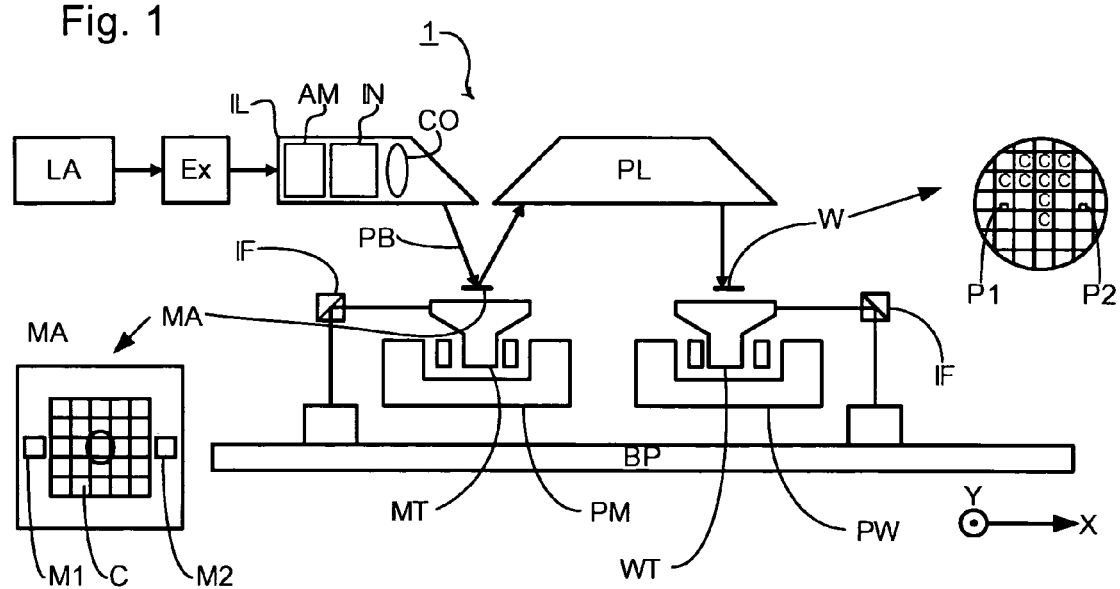
FIG. 1 depicts a lithographic projection apparatus according to a first exemplary embodiment of the present invention.

FIG. 1 schematically depicts a lithographic apparatus according to a an exemplary embodiment of the present invention. The apparatus includes an illumination system (illuminator) IL configured to provide a beam PB of radiation (e.g. UV or EUV radiation). A first support (e.g. a mask table) MT supports a patterning device (e.g. a mask) MA and is connected to a first positioning device PM that accurately positions the patterning device with respect to a projection system PL. A substrate table (e.g. a wafer table) WT holds a substrate (e.g. a resist-coated wafer) W and is connected to a second positioning device PW that accurately positions the substrate with respect to the projection system PL. The projection system (e.g. a reflective projection lens) PL images a pattern imparted to the beam PB by the patterning device MA onto a target portion C (e.g. including one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives radiation from a radiation source LA. The source and the lithographic apparatus may be separate entities, for example when the source is a plasma discharge source. In such cases, the source is not considered to form part of the lithographic apparatus and the radiation is generally passed from the source LA to the illuminator IL with the aid of a radiation collector including, for example, suitable collecting mirrors and/or a spectral purity filter. In other cases the source may be integral part of the apparatus, for example when the source is a mercury lamp. The source LA and the illuminator IL may be referred to as a radiation system.

The illuminator IL may include an adjusting device to adjust the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation PB having a desired uniformity and intensity distribution in its cross-section.

The beam PB is incident on the mask MA, which is held on the mask table MT. Being reflected by the mask MA, the beam PB passes through the projection system PL, which focuses the beam onto a target portion C of the substrate W. With the aid of the second positioning device PW and a position sensor IF2 (e.g. an interferometric device), the substrate table WT can be moved accurately, e.g. so as to position different target portions C in the path of the beam PB. Similarly, the first positioning device PM and a position sensor IF1 (e.g., an interferometric device) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
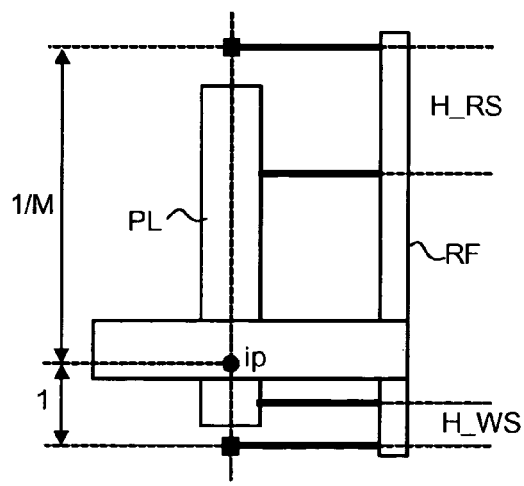
FIGS. 2 and 3 are diagrams showing the invariant points of projection systems with magnifications of −M and +M respectively.
Figure 3:
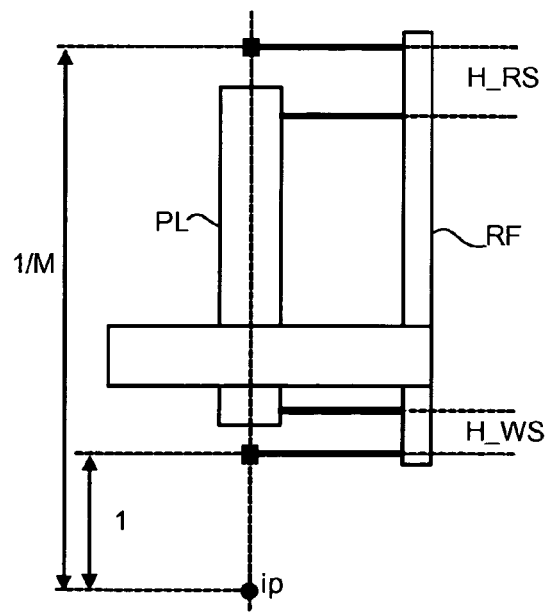
Figure 4:
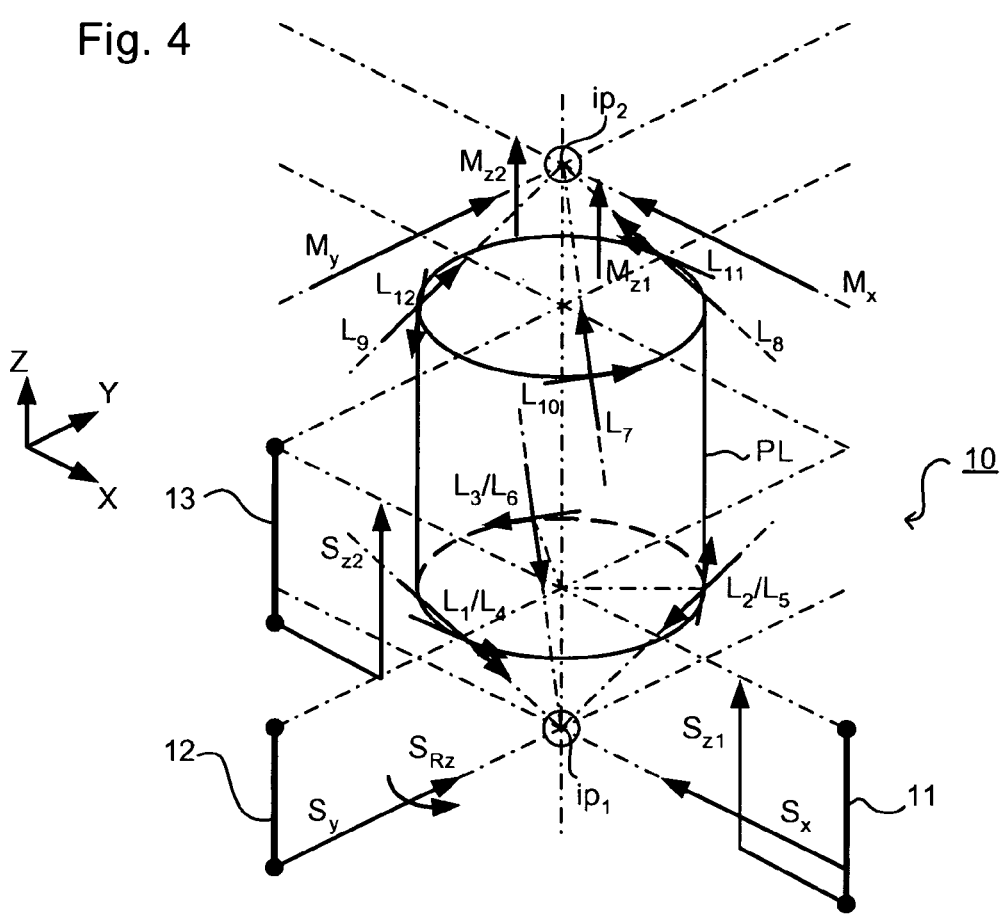
FIG. 4 is a diagram indicating measurement axes of sensors in a first embodiment of the present invention.

FIGS. 2 and 3 show the positions of the tilt-invariant points of a projection systems having a magnification of −M and +M, respectively (M<1), and where the measuring systems for the substrate and the patterning device are rigidly attached to a reference frame and measure the positions of the substrate and patterning device relative to the projection system bottom and projection system top, respectively. A rotation of the projection system about a tilt-invariant point does not result in an image translation. A translation relative to the tilt-invariant point does cause an image displacement. A rotation about a point away from the tilt-invariant point can be decomposed into a rotation about the tilt-invariant point and a translation, which can then be compensated for. M, for example may be ¼. With inverting magnification (sometimes referred to as a negative magnification), as shown in FIG. 2, the tilt-invariant point ip is within the projection system PL and by positioning reference beams suitable distances, H_WS and H_RS, above and below the substrate and mask tables, an interferometer based system for measuring the positions of the substrate and the mask tables relative to the projection system PL can be made to automatically take account of some rigid body motions of the projection system. However, as shown in FIG. 3, for a non-inverting system (positive magnification), the tilt invariant point is below the substrate stage and so the same arrangement cannot be used unless reference beams can be directed against the projection system above the mask table or below the substrate table, i.e. parts of the projection system must extend above and below the mask and substrate tables, which is impractical. This also applies to systems, whether inverting, non-inverting or inverting in one direction and non-inverting in the other, with either the patterning device or the substrate measuring system attached to an extremity of the projection lens. Accordingly, it is necessary to separately measure the position and/or displacements of the projection system and calculate the effects of any movements on image positioning, which can then be taken account of in the control of the mask and substrate table positions during and exposure. An arrangement 10 of sensors to accomplish this is described below with reference to FIG. 4.

Other arrangements of the reference frame and measuring systems may have other tilt invariant points. For example, if the projection system is non-rigidly coupled to a reference frame that carries two measuring systems, one to measure the position of the substrate or the patterning device relative to the frame and one to measure the projection system relative to the frame, there will be a tilt invariant point in the center of the image or object fields. With three measuring systems two invariant points may be defined.

It should be noted that the projection system PL, and its frame (which may be referred to below as the projection optics box), is not rigidly connected to the reference frame. Instead there is a compliant connection with a frequency of about 30 Hz, for example, and allowing displacements of the order of 100 nm, for example. Measurements are then taken from the reference frame of the positions of the object tables WT, MT and the projection system PL.

In this embodiment, the positions of the substrate table WT and the bottom of the projection system PL are measured relative to a Cartesian (XYZ) coordinate system having an origin at the intersection of the optical axis of the projection system PL and its focal plane. The lower invariant point $ip_1$ is shown ringed in FIG. 4. The position and orientation of the substrate stage is measured in the translation directions X, Y and Z and in rotation about the Z axis, Rz, by sensors mounted on sensor blocks 11, 12 and 13 and having measurement axes $S_x$, $S_y$, $S_{z1}$, $S_{z2}$, and $S_{Rz}$ as shown in the Figure. Two Z measurement sensors are used because it is inconvenient to arrange a Z measurement axis that passes through the origin. The sensor blocks 11, 12 and 13 are especially stable parts of the reference frame RF. For example, the sensor blocks can be formed of inserts of a low CTE material, such as ZERODUR®, ULE®, CLEARCERAM®, INVAR®, or the like, in the reference frame. Other construction materials such as stainless steel or aluminum may also be used if active stabilization (e.g., temperature control) is applied. Other materials may also be used if the thermal time constant of the reference frame is substantially longer than the time between calibration of object to image shifts or if the thermally induced shift is predicted using a feed forward model.

Simultaneously, the positions of the mask table MT and the top of the projection system PL are measured relative to a Cartesian coordinate system having an origin on the optical axis of the projection system and in the nominal object plane. The position of the mask table MT is measured using sensors having measurement axes $M_x$, $M_y$, $M_{z1}$ and $M_{z2}$ in a similar manner to the measurement of the substrate table WT position. Rotation of the mask table about the Z axis ($M_{Rz}$) can be provided by combining two Y measurements, or with an angle encoder, for example as described below.

At the bottom of the projection system a set of sensors 10 is provided to measure the position of the projection system PL relative to the lower invariant point $ip_1$. These sensors have six measurement axes $L_1$ to $L_6$ which are grouped in pairs: $L_1/L_4$, $L_2/L_5$, $L_3/L_6$. One of the measurement axes of each pair, $L_1$ $L_2$ $L_3$, passes through the lower invariant point $ip_1$ while the other of each pair, $L_4$ $L_5$ $L_6$, is substantially orthogonal. The signals from these sensors can thus be combined to determine the position of the bottom end of the projection system PL relative to the lower invariant point $ip_1$. The sensors may include three two-dimensional (or three pairs of one-dimensional) encoders mounted on the reference frame RF at positions approximately 120° apart.

At the top of the projection system PL a similar arrangement is provided with sensors having measurement axes $L_7$ to $L_{12}$. Again these are paired with one measurement axis of each pair passing through the upper invariant point $ip_2$ (ringed in FIG. 4) and the other of each pair being substantially orthogonal to the first of each pair.

It will be apparent that the above system has redundancy of measurement, which may be reduced.

In a second embodiment of the present invention, which is the same as the first embodiment save as described below, a single reference frame is used.

Figure 5:
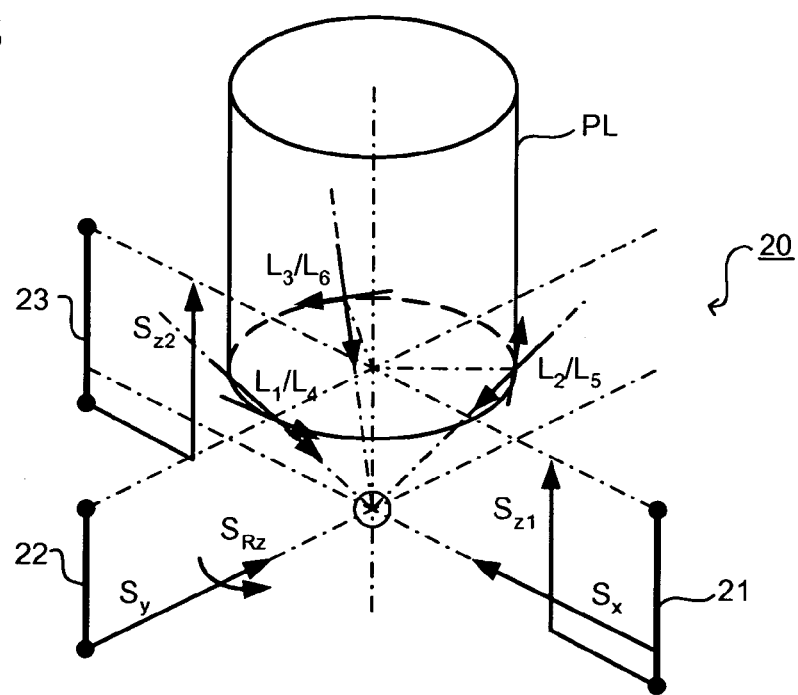
FIG. 5 is a diagram indicating measurement axes of sensors in a second embodiment of the present invention.

FIG. 5 shows the arrangement at the bottom of the projection system PL. This has an arrangement of sensors 20 mounted on sensor blocks 21, 22, 23 that is essentially the same as in the first embodiment. However, no sensors are mounted at the top of the projection system PL, instead the position of the mask table is measured using interferometers (not shown) mounted on the projection lens. This arrangement reduces the number of redundant sensors but the accuracy of the measurements is dependent on the relatively long path through the reference frame between mask level and substrate level. Thermal drift and dynamic movement of the reference frame must therefore be reduced further.

In a third embodiment of the present invention, which may be the same as the first embodiment of the invention save as described below, the sensors for measuring the position of the projection system are mounted rigidly and thermally stably in relation to corresponding substrate table position sensors.

Figure 6:
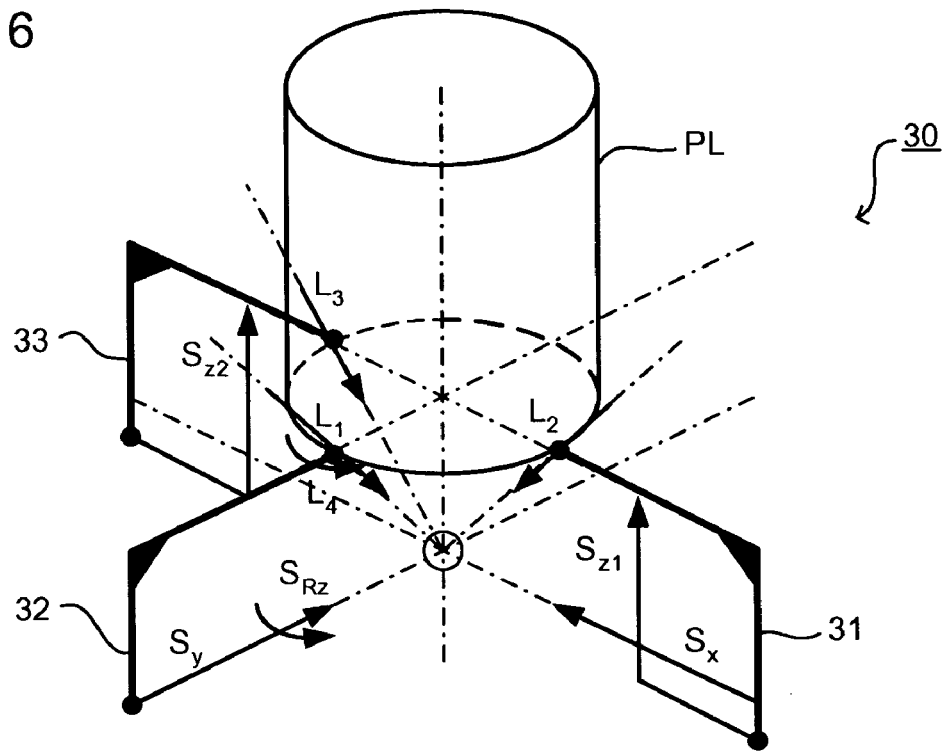
FIG. 6 is a diagram indicating measurement axes of sensors in a third embodiment of the present invention.

As shown in FIG. 6, the substrate table position in X, Y, Z and Rz is measured by sensors having measurement axes $S_x$, $S_y$, $S_{z1}$, $S_{z2}$ and $S_{Rz}$ arranged in the same way as in the first embodiment.

The positions and orientation of the projection system PL in the same four degrees of freedom are measured by sensors having measurement axes $L_1$ to $L_4$, also shown in FIG. 6. Axis $L_1$ is measured by a sensor mounted on sensor block 32, to which the sensor for measuring displacements of the substrate table in the Y direction is mounted, and primarily measures displacements of the projection system PL in the Y direction. Measurement axis $L_1$ is necessarily inclined to the Y direction and hence the measurement will include some dependence on Z displacements which is subtracted by reference to measurements on axes $L_2$ and $L_3$. Likewise, the sensors measuring on measurement axes $L_2$ and $L_3$, which primarily measure the displacements in the X and Z directions, are mounted on sensor blocks 31 and 33 to which are also mounted the sensors for measurement of X and Z displacements of the substrate table. Measurement axis $L_4$ is a direct measurement of the angle of rotation of the projection lens about the Z axis and is measured by a sensor mounted to sensor block 32 to which the sensor for Rz movements of the substrate table is also connected. An angular encoder suitable for making such a measurement is described below.

With the sensor in this arrangement 30, the sensors for projection system position are mounted in a plane at the bottom of the projection system and close to the plane of the substrate table position sensors. Sensors with a ratio of active range to resolution in the range of $10^3$ to $10^4$ can be used, meaning that a wide variety of sensors can be used, e.g. interferometers, or encoders (linear or 2D).

It will be appreciated that if the movements of the projection lens system relative to the reference frame in a given direction, e.g. Rx, Ry, can be assumed to be sufficiently small, measurement in that direction may be omitted.

Figure 7:
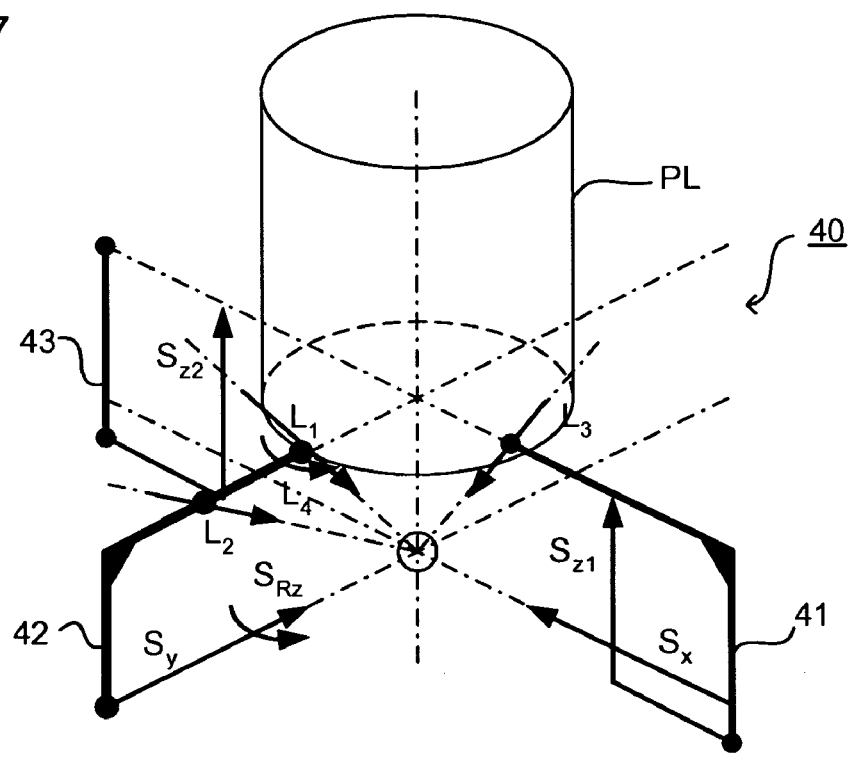
FIG. 7 is a diagram indicating measurement axes of sensors in a fourth embodiment of the present invention.

A fourth embodiment of the present invention, which is the same as the third embodiment save as described below, uses a modified arrangement 40 of sensors to measure the position and/or displacements of the projection system PL. This arrangement 40 of sensors is shown in FIG. 7.

In the fourth embodiment of the present invention, measurement axes $L_1$ and $L_4$ are the same as in the third embodiment. However, the sensor for measurement axis $L_2$ is instead mounted on the sensor block 42 to which the Y sensor for the substrate stage is attached, spaced from the sensor for measurement axis $L_1$. Measurement axes $L_1$ and $L_2$ thereby provide measurement of the Y and Z positions of the projection system. The sensor for measurement axis $L_3$ is mounted on the sensor block 41 carrying the X sensor for the substrate table and, corrected for Z displacements, provides information as to movements in X of the projection system. The sensors for measurements of two linear degrees of freedom, Y and Z, are therefore combined on a single sensor block so that no projection system sensor need be positioned on sensor block 43, which carries the second Z sensor for the substrate table. This allows for a more compact arrangement of sensors and additional design freedom. This arrangement is also less sensitive to thermal drift and the dynamics of the reference frame.

A fifth embodiment of the present invention, which may be the same as the third save as described below, omits certain measurements and may be used where the corresponding movement so the projection system are expected to be small.

Figure 8:
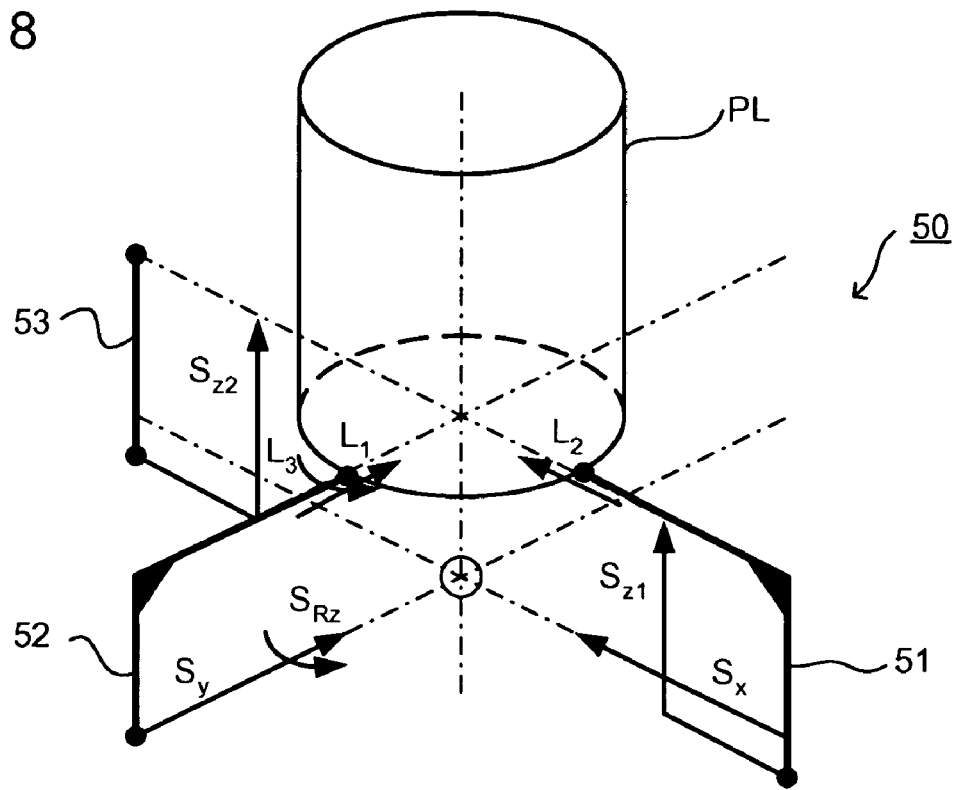
FIG. 8 is a diagram indicating measurement axes of sensors in a fifth embodiment of the present invention.

As shown in FIG. 8, the sensor arrangement 50 includes substrate table position sensors that are the same as the third embodiment. The position sensors for the projection system are mounted on sensor blocks 51, 52 to which corresponding substrate table sensors are mounted but only measure X, Y and Rz movements of the projection system using measurement axes $L_2$, $L_1$ and $L_3$ respectively. No measurement of Rx, Ry and Z position of the projection system is made and this embodiment is therefore used only when movements in these directions can be assumed small enough.

A sixth embodiment of the present invention is based on the fifth but additionally measures the Rx and Ry position of the projection system.

Figure 9:
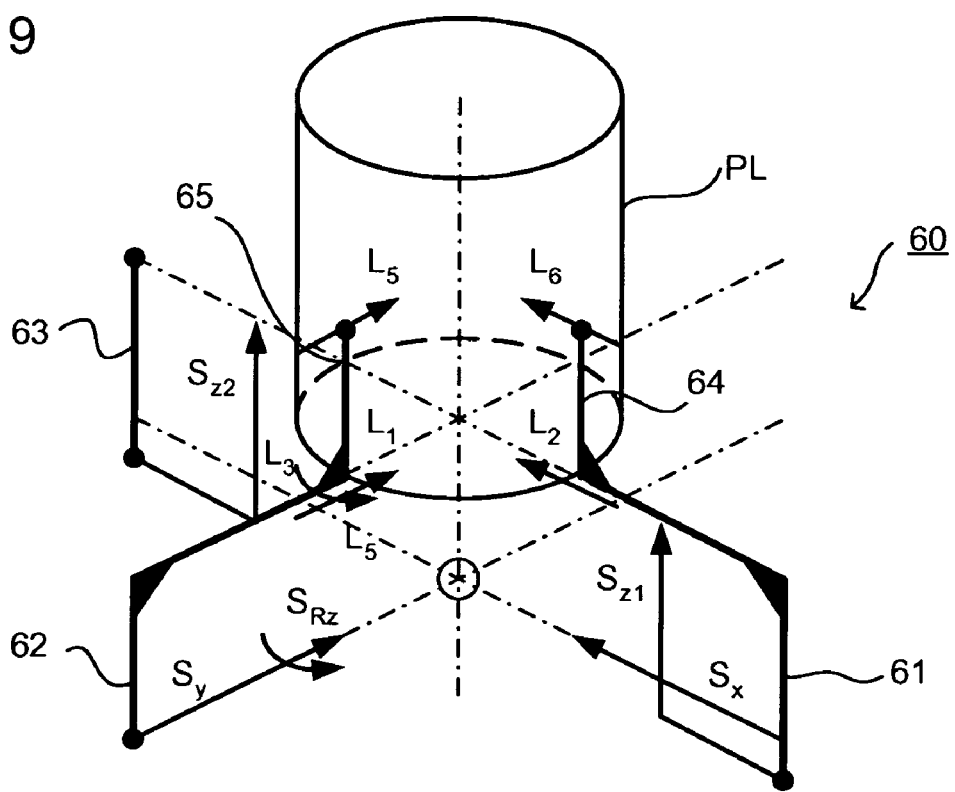
FIG. 9 is a diagram indicating measurement axes of sensors in a sixth embodiment of the present invention.
Figure 11:
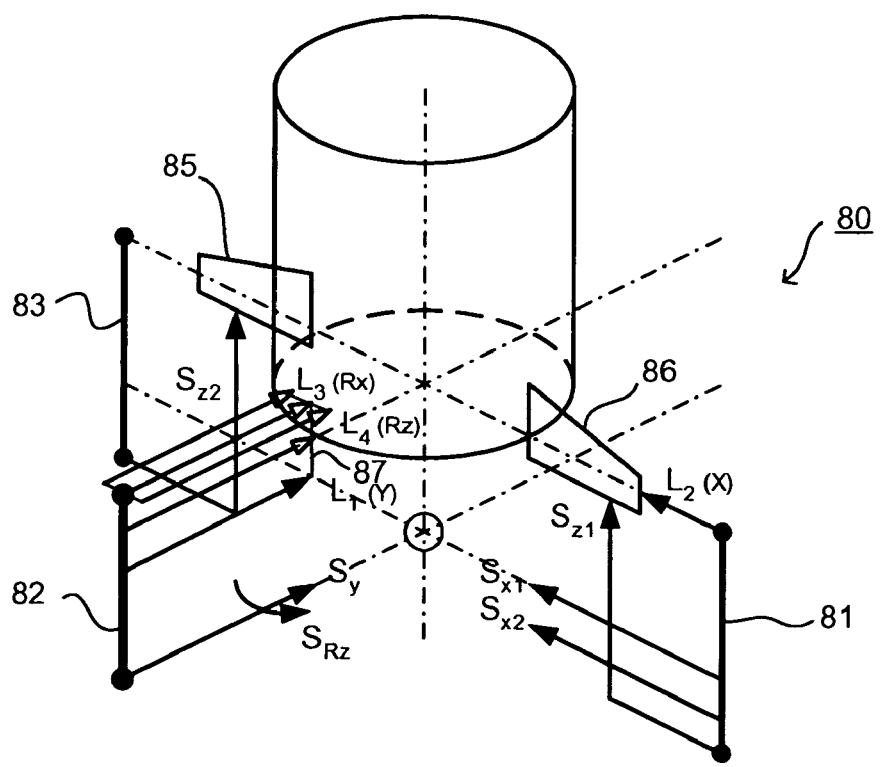
FIG. 11 is a diagram indicating measurement axes of sensors in a eighth embodiment of the present invention.
Figure 12:
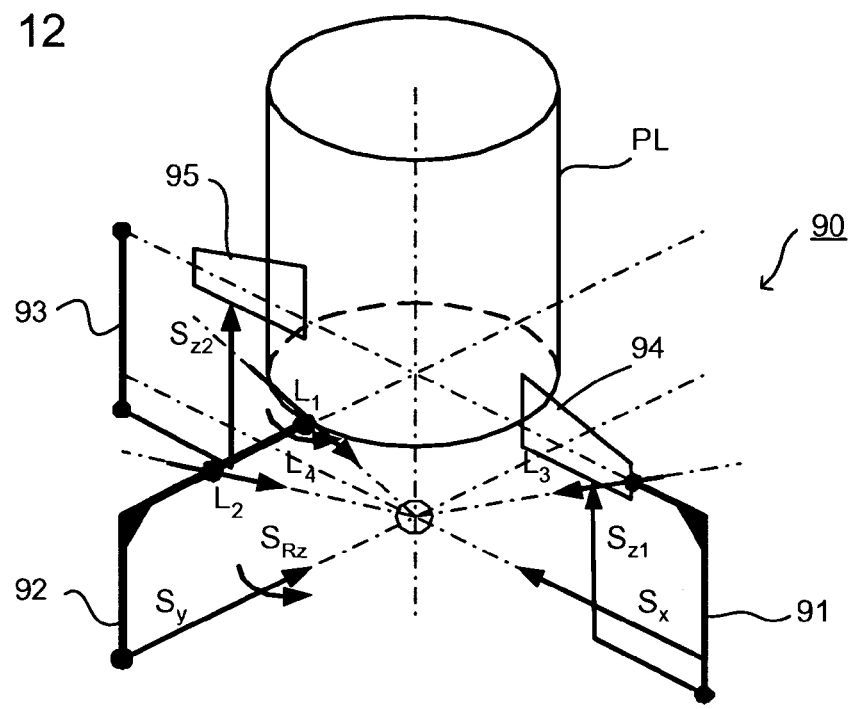
FIG. 12 is a diagram indicating measurement axes of sensors in a ninth embodiment of the present invention.

As can be seen from FIG. 9, the sixth embodiment is the same as the fifth except that the sensor arrangement 60 additionally includes measurement axes $L_5$, $L_6$ which measure X and Y movements of the projection system at locations spaced in Z from axes $L_1$, $L_2$ and can thus be used to derive measurements of the movements of the projection system in Rx and Ry. The respective sensors are mounted on rigid extensions 64, 65 of sensor blocks 61, 62 respectively. A Z lens measurement may be included by providing two measurement axes $S_{z1}$ and $S_{z2}$ directed against mirrors attached to either side of the projection system, as shown in FIGS. 11 and 12.

Figure 10:
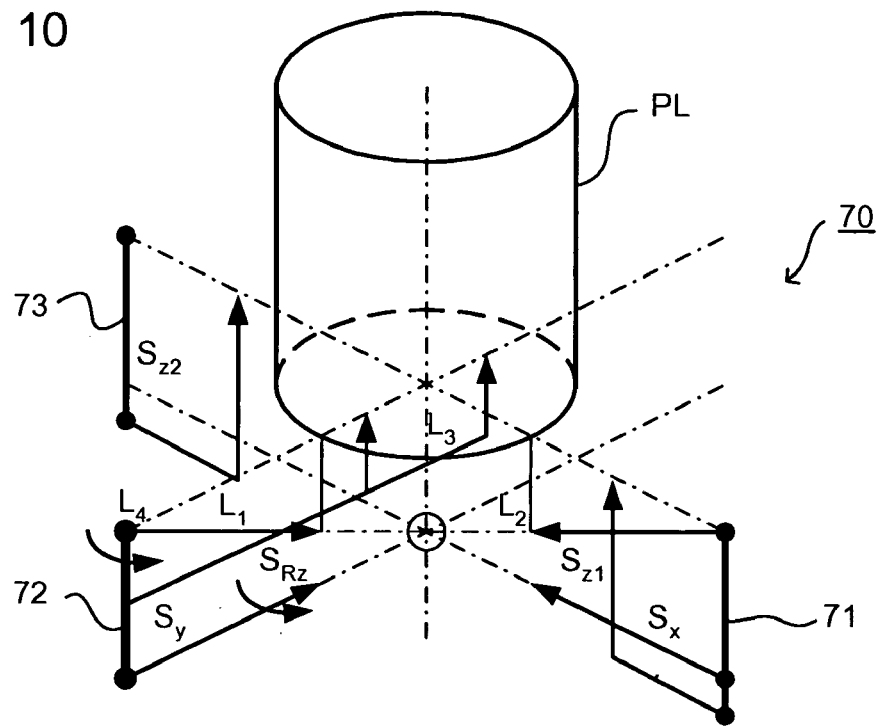
FIG. 10 is a diagram indicating measurement axes of sensors in a seventh embodiment of the present invention.

A seventh embodiment of the present invention, which is the same as the third embodiment save as described below, uses a further alternative arrangement of sensors 70 for projection system measurement, shown in FIG. 10.

In the seventh embodiment, interferometers are used to measure the translational degrees of freedom of the projection system PL. Measurement axes $L_1$ and $L_2$ are inclined to the XY plane and measured by interferometers directing beams from sensor blocks 72 and 71 respectively onto mirrors mounted on extensions (not shown) of the reference frame. Sensor block 72 also carries components to direct interferometer beams to two symmetric positions about the projection system center to make a differential measurement of the Z position of the projection system.

An eighth embodiment of the present invention, which may be the same as the first save as described below, employs a sensor arrangement 80 that corrects for the Abbé arm between the substrate and the axis for measurement of the projection system position in X. In this embodiment, X, Y, Rz and Rx are measured from the reference frame to the projection lens and substrate stable while Z and Ry are measured directly between projection lens and table.

The sensor arrangement 80 is shown in FIG. 11 and employs a substrate stage position measurement system which is the same as that of the first embodiment.

The projection system measurement system has measurement axes $L_1$ and $L_2$ for Y and X respectively, and axes $L_3$ and $L_4$ for Rx and Rz.

Axes $L_1$, $L_3$ and $L_4$ are measured by sensors mounted on sensor block 82, which also mounts the sensors for measurement of the substrate table Y and Rz positions $S_y$ and $S_{Rz}$. These sensors include interferometers with beams directed against a mirror mounted on the projection system PL. For convenience of layout, that mirror may extend below the bottom of the projection system PL. The interferometers for Rx and Rz involve two beams each (indicated with open-headed arrows) directed against the mirror at positions spaced apart in a direction orthogonal to the axis about which they measure rotation.

Axis $L_2$ is measured by an interferometer mounted on sensor block 81 which also mounts sensors for substrate table measurement axes $S_{x1}$, $S_{x2}$, which measure Ry of the substrate stage. The interferometer conveniently directs its beam against one of the horizontal mirrors 85, 86 used for the substrate table Z measurement. The two Z axes measure Ry of the substrate stage with respect to the projection optics box. The mirrors 85, 85 are fixed to the projection optics box while sensor blocks 81, 82 and 83 are fixed to the reference frame.

To correct for the Abbé arm, the known rotation of the projection optics box about the Y axis, Ry-POB, is used. The change in X is given by the product of Ry-POB and the Abbé arm, i.e. the distance in Z from measurement axis L2 to the center of the image field.

All interferometer areas in this arrangement are orthogonal, simplifying the calculation of the position information and avoiding cross-talk between degrees of freedom.

A ninth embodiment of the present invention is similar to the fourth embodiment but the reference mirrors for the substrate table Z measurement are mounted to the projection system PL.

The sensor arrangement 90 is shown in FIG. 12. For the substrate table position measurement, sensors for measurement axes $S_x$ and $S_{z1}$ are attached to sensor block 91, for $S_{Rz}$ and $S_y$ are attached to sensor block 92 and for $S_{z2}$ are attached to sensor block 93. The sensors for projection system measurement axes $L_1$, $L_2$ and $L_4$ are attached to sensor block 92 and $L_3$ is attached to sensor block 91. Sensor block 91, 92 and 93 are fixed to the reference frame while mirrors 94, 95 are fixed to the projection optics box.

Figure 13:
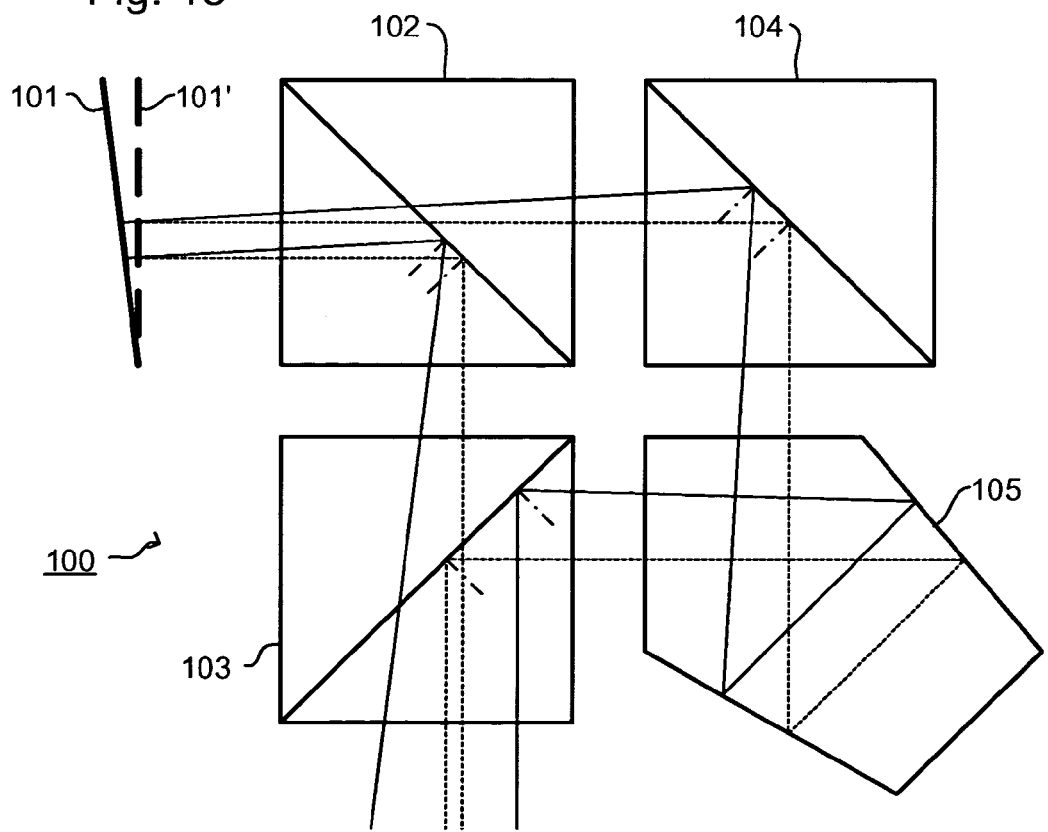
FIG. 13 is a diagram of an angular encoder according to the present invention.

An angular encoder useable in the embodiments described above, and in other applications in lithography and other technical fields, is shown in FIG. 13.

The encoder includes an optical module 100 and a target 101 which are mounted on the two parts whose relative angular position is to be measured. Note that the encoder measures changes in relative angle, for measurement of absolute angle a calibration is required. For example, the target 101 may be mounted on the projection system and the optical module 100 on the reference frame, or vice versa. In this embodiment, the target 101 is a grating, either a transmission grating illuminated from behind or a reflection grating illuminated from the front. Light from the grating enters the optical module 100 where it is divided to travel along two optical paths by a first beam splitter 102. The light on the first path passes directly to second beam splitter 103 which recombines the beams from the two paths. The second optical path is folded by third beam splitter 104 and passes through prism 105 before being recombined with the first optical path by the second beam splitter 103. The prism 105 is pentagonal in cross-section and arranged such that the beam following the second optical path undergoes two internal reflections in the prism and crosses over itself As can be seen in FIG. 13 by comparing the solid ray traces representing the situation when the grating 101 is in the position indicated by a solid line with the dashed ray traces indicating the situation when the grating is in position indicated by a dashed line 101', the first and second optical paths have opposite sensitivity to relative angular movement (tilt) between the target 101 and the optical module 100. Thus, when the beams from the two paths are focused into images of the target by suitable optics (not shown) the images of the target deriving from the two paths will move in opposite directions. Moiré patterns are formed in the overlapped images and can easily be detected to measure tilt and changes in tilt between the target and optical module.

Figure 14:
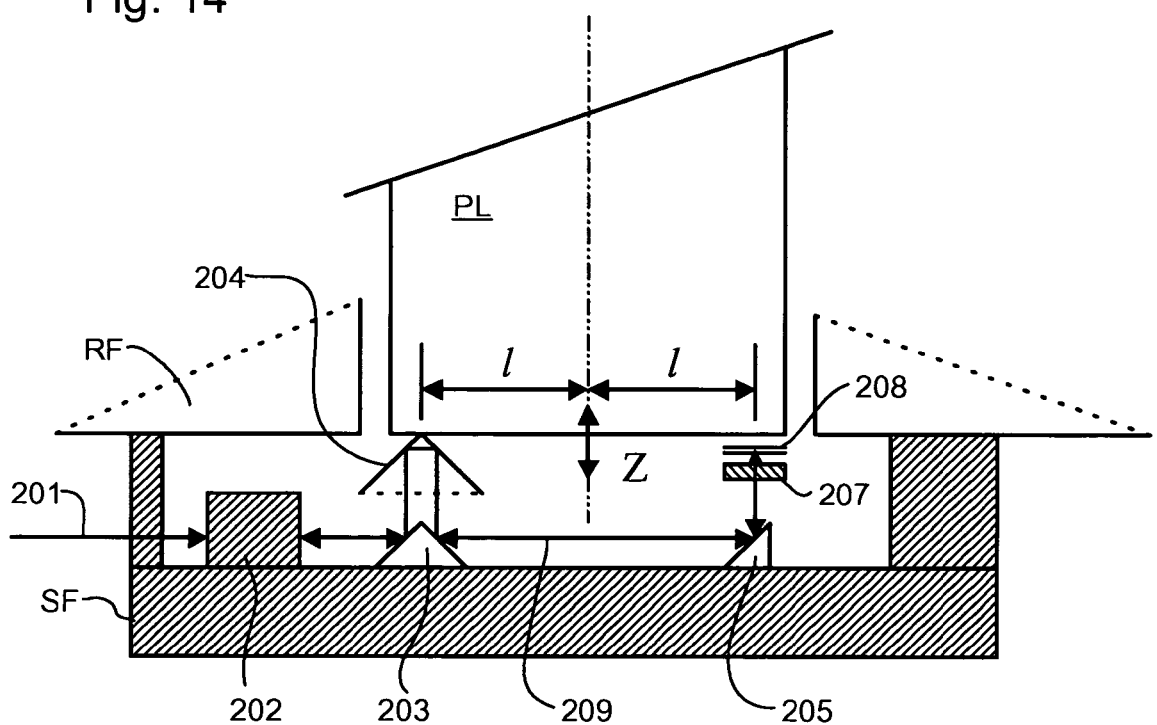
FIG. 14 is a diagram of an arrangement to measure the Z-position of the optical axis of the projection system.

An arrangement for measuring the Z-position of the optical axis of the projection system is shown in FIG. 14. This may be used in any of the embodiments of the invention described above. An input/output beam 201 is supplied to a plane mirror, double beam interferometer 202 with internal reference mirror. The measurement beam is directed along measurement beam path 209 in which prism 203 directs the beam through ninety degrees to corner cube 204 mounted on the projection system and also directs the returned beam back onto measurement path 209. Bending mirror 205 directs the beam at ninety degrees to a ¼ wave plate 207 and then reflecting mirror 208 mounted on the projection system. The corner cube 204 and reflecting mirror 208 are both mounted a distance l from the optical axis, indicated by the chain line. The interferometer 202, prism 203 and bending mirror 205 are all mounted on a subframe SF which is connected to the reference frame RF.

While specific embodiments of the invention have been described above, it will be appreciated that the invention may be practiced otherwise than as described. For example, the various sensor arrangements described to measure the position and/or displacements of the substrate table may also be applied with suitable modifications to measure the positions and/or displacements of the mask table. The description is not intended to limit the invention.

What is claimed is:

1. A lithographic projection apparatus, comprising:
   a radiation system configured to provide a beam of radiation;
   a support configured to support a patterning device, the patterning device configured to pattern the beam according to a desired pattern;
   a substrate table configured to hold a substrate;
   a projection system configured to project the patterned beam onto a target portion of the substrate;
   a reference frame;
   a first measuring system configured to measure at least one of positions and displacements of the substrate table relative to the reference frame, the measuring system including a plurality of first sensors mounted on the reference frame and having respective measurement axes; and
   a second measuring system configured to measure at least one of positions and displacements of the projection system relative to the reference frame, the measuring system including a plurality of second sensors mounted on the reference frame and having respective measurement axes, wherein at least one sensor of the second measuring system has a measurement axis passing through an invariant point of the projection system and the second measuring system comprises three linear sensors configured to measure along measurement axes passing through the invariant point.

2. An apparatus according to claim 1, wherein the projection system is non-inverting.

3. An apparatus according to claim 1, wherein a first linear sensor and a second linear sensor of the three linear sensors are rigidly mounted to a same mount at spaced apart locations.

4. An apparatus according to claim 1, wherein the three linear sensors are linear encoders.

5. An apparatus according to claim 1, wherein the second measurement system further comprises a sensor configured to make a direct measurement of angle.

6. An apparatus according to claim 1, wherein the second measuring system further comprises three sensors each having a measurement axis substantially orthogonal to the measurement axis of a respective one of the three linear sensors so as to form a measurement system configured to measure six degrees of freedom.

7. An apparatus according to claim 1, wherein at least one sensor of the second measuring system has a measurement axis corresponding to a measurement axis of the first measuring system and is mounted rigidly in relation to the corresponding sensor of the first measurement system.

8. An apparatus according to claim 7, wherein the sensors of the second measuring system primarily measuring the three translational degrees of freedom, X, Y and Z, are stably connected to respective sensors in the first measuring system.

9. An apparatus according to claim 8, wherein the sensors of the second measuring system that are mounted stably in relation to the respective sensors in the first measuring system are mounted on a same block of material as the respective sensors.

10. An apparatus according to claim 9, wherein the material is a material having a low coefficient of thermal expansion.

11. An apparatus according to claim 8, wherein the sensors of the second measuring system that are mounted stably in relation to the respective sensors in the first measuring system are mounted on a subframe provided with active temperature stabilization.

12. An apparatus according to claim 7, wherein the second measuring system comprises a sensor configured to primarily measure in the Y direction and rigidly mounted to a sensor of the first measuring system configured to measure the substrate table position in the Y direction, two sensors configured to primarily measure in the X and Z directions and rigidly connected to sensors of the first measuring system configured to measure in the X and Z directions.

13. An apparatus according to claim 7, wherein the second measuring system comprises a sensor configured to primarily measure in the X direction and rigidly mounted to a sensor of the first measuring system configured to measure the substrate table position in the X direction, two sensors configured to primarily measure in the Y and Z directions and rigidly connected to a sensor of the first measuring system configured to measure in the Y direction.

14. An apparatus according to claim 7, wherein the second measuring system comprises a first interferometer configured to primarily measure in the Y direction and rigidly mounted to a sensor of the first measuring system configured to measure the substrate table position in the Y direction, a second interferometer configured to primarily measure in the X direction and rigidly connected to a sensor of the first measuring system configured to measure in the X direction, and a third interferometer configured to measure only in the Z direction and mounted rigidly to the sensor of the first measuring system configured to primarily measure in the Y direction.

15. An apparatus according to claim 1, wherein the second measuring system comprises an angular encoder comprising:
a target;
an optical module comprising: a first beam splitter for directing light from the target into first and second optical paths, a first optical element in at least one of the optical paths wherein one of the paths has an opposite sensitivity to tilt than the other of the optical paths, and a second optical element that recombines light from the first and second optical paths and projects two overlapping images of the target, and relative rotation of the target and the optical module causes relative movement of the two overlapping images.

16. An apparatus according to claim 15, wherein the second optical element is a beam splitter.

17. An apparatus according to claim 1, wherein the projection system is inverting.

18. A device manufacturing method, comprising:
projecting a patterned beam of radiation onto a target portion of a layer of radiation-sensitive material at least partially covering a substrate using a projection system;
measuring at least one of positions and displacements of the substrate table relative to a reference frame using a first measuring system including a plurality of first sensors mounted on the reference frame and having respective measurement axes;
measuring at least one of positions and displacements of the projection system relative to the reference frame using a second measuring system including a plurality of second sensors mounted on the reference frame and having respective measurement axes, wherein at least one sensor of the second measuring system has a measurement axis passing through an invariant point of the projection system and is mounted rigidly in relation to the corresponding sensor of the first measuring system, wherein the second measuring system comprises three linear sensors configured to measure along measurement axes passing through the invariant point.

19. An angular encoder comprising:
a target;
an optical module comprising a first beam splitter configured to direct light from the target into first and second optical paths;
a first optical element in at least one of the optical paths, wherein one of the paths has an opposite sensitivity to tilt than the other of the optical paths; and
a second optical element configured to recombine light from the first and second optical paths and to project two overlapping images of the target, wherein relative rotation of the target and the optical module causes relative movement of the two overlapping images, wherein the target comprises a grating.

20. An encoder according to claim 19, wherein the second optical element is a beam splitter.

21. An angular encoder according to claim 19, wherein the first optical element comprises a prism having a pentagonal cross-section and light traversing the second optical path undergoes two internal reflections in the prism and crosses over itself.

* * * * *